(12) United States Patent
Gruensteidl et al.

(10) Patent No.: US 12,538,589 B2
(45) Date of Patent: Jan. 27, 2026

(54) THIN-FILM SOLAR MODULE AND MANUFACTURING METHOD THEREOF

(71) Applicant: CNBM RESEARCH INSTITUTE FOR ADVANCED GLASS MATERIALS GROUP CO., LTD., Bengbu (CN)

(72) Inventors: Stefan Gruensteidl, Grafing (DE); Peter Borowski, Grafing (DE); Thomas Dalibor, Grafing (DE); Joerg Palm, Grafing (DE)

(73) Assignee: CNBM RESEARCH INSTITUTE FOR ADVANCED GLASS MATERIALS GROUP CO., LTD., Anhui (CN)

( * ) Notice: Subject to any disclaimer, the term of this patent is extended or adjusted under 35 U.S.C. 154(b) by 0 days.

(21) Appl. No.: 19/215,962

(22) Filed: May 22, 2025

(65) Prior Publication Data
US 2025/0287704 A1    Sep. 11, 2025

Related U.S. Application Data

(63) Continuation of application No. PCT/CN2023/118815, filed on Sep. 14, 2023.

(51) Int. Cl.
| | |
|---|---|
| H10F 19/75 | (2025.01) |
| H10F 19/31 | (2025.01) |
| H10F 19/80 | (2025.01) |
| H10F 71/00 | (2025.01) |
| H10F 77/12 | (2025.01) |

(52) U.S. Cl.
CPC ............. *H10F 19/75* (2025.01); *H10F 19/31* (2025.01); *H10F 19/80* (2025.01); *H10F 71/00* (2025.01); *H10F 77/126* (2025.01)

(58) Field of Classification Search
CPC .......... H10F 19/31; H10F 19/75; H10F 19/80; H10F 71/00; H10F 77/126
See application file for complete search history.

(56) References Cited

U.S. PATENT DOCUMENTS

| | | | |
|---|---|---|---|
| 4,759,803 A | 7/1988 | Cohen | |
| 5,261,969 A | 11/1993 | Stanbery | |
| 6,452,086 B1 | 9/2002 | Muller | |
| 9,029,685 B2 | 5/2015 | Kinsey | |
| 2005/0133086 A1* | 6/2005 | Itoyama | H10F 19/904 136/252 |

(Continued)

FOREIGN PATENT DOCUMENTS

| | | |
|---|---|---|
| CN | 103155173 A | 6/2013 |
| CN | 105428439 A | 3/2016 |

(Continued)

*Primary Examiner* — Golam Mowla

(57) ABSTRACT

The bypass diode of each monolithic cell is formed on a substrate in the form of a thin film, and adopts a structure similar to that of the monolithic cell; each monolithic cell and the corresponding bypass diode share the same substrate; a layer treatment method for the thin film in a bypass diode region on the substrate is different from that for a cell region, and a compound material or layer sequence adopted as the layer of the thin film in the bypass diode region on the substrate is different from that in the cell region, so as to decrease a threshold voltage of the bypass diode.

18 Claims, 11 Drawing Sheets

(56) References Cited

U.S. PATENT DOCUMENTS

2005/0275057 A1  12/2005  Breen
2010/0078057 A1   4/2010  Karg
2014/0060610 A1   3/2014  Moslehi

FOREIGN PATENT DOCUMENTS

| | | |
|---|---|---|
| CN | 115084300 A | 9/2022 |
| EP | 1605512 A2 | 12/2005 |
| EP | 1443566 B1 | 10/2008 |
| EP | 1914808 B1 | 4/2018 |
| EP | 2005474 B1 | 9/2019 |
| JP | 2021514115 A | 6/2021 |
| WO | 0106565 A1 | 1/2001 |
| WO | 03054926 A2 | 7/2003 |
| WO | 2006053518 A1 | 5/2006 |
| WO | 2007118814 A2 | 10/2007 |
| WO | 2009135685 A2 | 11/2009 |
| WO | 2010111295 A2 | 9/2010 |
| WO | 2013058724 A2 | 4/2013 |
| WO | 2013075144 A1 | 5/2013 |
| WO | 2015096689 A1 | 7/2015 |

\* cited by examiner (array of) bypassdiode(s):

THIN-FILM SOLAR MODULE AND MANUFACTURING METHOD THEREOF

CROSS-REFERENCE TO RELATED APPLICATIONS

This application is a continuation of International Patent Application No. PCT/CN2023/118815, filed on Sep. 14, 2023. The content of the aforementioned applications, including any intervening amendments thereto, are incorporated herein by reference.

TECHNICAL FIELD

The present invention relates to the field of thin-film photovoltaic cell technology, and in particular, to a thin-film photovoltaic solar module and a manufacturing method thereof.

BACKGROUND

The solar module is composed of monolithic solar cells connected in series, and the photovoltaic generator is composed of solar modules connected in series. In the case of shading of PV modules within an otherwise unshaded string of PV modules, reverse voltages can occur on the shaded modules, with the potential of damaging those. This can be prevented by bypass diodes that operate in parallel to each PV module.

The bypass diodes play a protective role when many cells are shaded, but cannot play a protective role when a smaller number of cells within a PV module are shaded. In these cases, the shaded individual cells may still be exposed to potentially detrimental reverse voltage.

Economically and technically, it is not feasible to install a large number of ordinary diodes (at most one diode for each monolithic solar cell). Therefore, for a monolithic thin-film module, there is a method for converting part of the surface of a thin-film photovoltaic cell into a bypass diode in the process of manufacturing, so as to limit the maximum reverse voltage under shading. This manufacturing method for an integrated bypass diode has been described in the patent EP2005474B1. However, the cell material is usually designed to be used at a forward voltage under illumination, so it is not suitable for use as a diode in the dark in practice. Therefore, due to a high threshold voltage, high power loss occurs in the diode. As a result, the cell surface of the diode must be very large relative to the solar cell surface due to the generation of heat, and further, the electrical power of the module is reduced too much.

In the prior art, there are two methods for manufacturing bypass diodes of thin-film photovoltaic cells, the first is a conventional external diode with a low threshold voltage, and the second is a solution of an integrated bypass diode for monolithically connected thin-film modules in the European patent EP2005474B1. Among the two aforementioned methods, the first method is only suitable for cell strings in encapsulated solar modules in terms of difficulty and manufacturing cost, and integrated bypass diodes manufactured by the second method have a too high threshold voltage, further resulting in high power loss.

A further possible solution is to apply a bypass diode as a so called tandem structure on top or under the material of a monolithic thin-film cell. This method has been described in many differently implemented patents (US000004759803A, US000005261969A, EP000001443566B1, WO002001006565A1, US000006452086B1, WO002003054926A2, US020050275057A1, WO002006053518A1, US000009029685B2, EP000001914808B1, WO002010111295A2 and WO002013058724A2). However, these methods need more significant intervention in the process of manufacturing and have multiple additional steps. These problems cannot be integrated into industrial production economically, besides the technical problem of the so-called tandem structure.

The same applies to circuits integrated on monolithic thin-film cell materials, as described in the patent specification WO002013075144A1 or EP000001605512A2, which are too extensive for a viable production process.

Content of the Invention

In view of the aforementioned problems existing in the prior art, the present invention provides a thin-film photovoltaic solar module and a manufacturing method thereof. The integrated bypass diode manufactured by the method has the diode characteristic of a low threshold voltage, so that the bypass diode can significantly reduce the reverse voltage during shading to prevent potential damage of cell material, reduce heat loss in the bypass diode, and reduce the area required by the manufacturing of the integrated bypass diode on a solar module, thereby minimizing the loss of the cell module area for electricity generation. The technical solution of the invention is as follows:

In a first aspect, thin-film photovoltaic cells with the integrated bypass diodes are provided, wherein the bypass diode of each monolithic cell is formed on a substrate in the form of a thin film, and adopts a structure similar to that of the monolithic cell; each monolithic cell and the corresponding bypass diodes share the same substrate; a layer treatment method for the thin film in a bypass diode region on the substrate is different from that for a cell region, and a compound material adopted as the layer of the thin film in the bypass diode region on the substrate is different from that in the cell region, so as to decrease a threshold voltage of the bypass diode.

In some embodiments, the layer comprises, but is not limited to, an absorber layer and an additional layer for the passivation of grain boundary defects and lattice defects, the layer treatment method comprises a deposition treatment process and a heat treatment process for the layer, wherein the deposition treatment process includes PVD (Physical Vapor Deposition) coating process, thermal evaporation and spraying.

In some embodiments, when the layer of the cell region on the substrate is treated, the bypass diode region is covered with a covering frame structure, so that the layer treatment in the cell region and the layer treatment in the bypass diode region are not performed at the same time and a thin-film compound material applied in the cell region is prevented from infiltrating into the bypass diode region.

In some embodiments, the covering frame structure is made of a ceramic material.

In some embodiments, for a monolithic thin-film photovoltaic cell, a compound material adopted as the absorber layer in the cell region comprises a chalcopyrite compound semiconductor containing chalcogen, and a compound material adopted as the absorber layer in the bypass diode region is a chalcopyrite compound semiconductor without sulfur.

In some embodiments, for the monolithic thin-film photovoltaic cell, the sulfur content in the compound material adopted as the absorber layer in the bypass diode region is less than that in the compound material adopted as the absorber layer in the cell region.

In some embodiments, for the monolithic thin-film photovoltaic cell, when the absorber layer is treated, the absorber layer in the cell region and the absorber layer in the bypass diode region are treated separately, and when the absorber layer in the cell region is treated, the bypass diode region is covered with the covering frame structure, so as to prevent the compound material adopted as the absorber layer in the cell region from infiltrating into the bypass diode region.

In some embodiments, the additional layer for the passivation of grain boundary defects and lattice defects comprises a PDT (post-deposition treatment) post-treatment layer applied on the surface of the absorber layer.

In some embodiments, for the monolithic thin-film photovoltaic cell, the PDT post-treatment layer is applied on the surface of the absorber layer in the cell region but not applied on the surface of the absorber layer in the bypass diode region.

In some embodiments, for the monolithic thin-film photovoltaic cell, the amount of a compound material adopted as the PDT post-treatment layer in the bypass diode region is less than the amount of the compound material adopted as the PDT post-treatment layer in the cell region.

In some embodiments, for the monolithic thin-film photovoltaic cell, when the PDT post-treatment layer is treated, the PDT post-treatment layer in the cell region and the PDT post-treatment layer in the bypass diode region are treated separately, and when the PDT post-treatment layer in the cell region is treated, the bypass diode region is covered with the covering frame structure, so as to prevent the compound material adopted as the PDT post-treatment layer in the cell region from infiltrating into the bypass diode region.

In some embodiments, during heat treatment in the process of making the thin-film photovoltaic cell, the cell region is partially heated by local annealing methods (e.g. local laser pulse annealing).

In some embodiments, during heat treatment in the process of making the thin-film photovoltaic cell, the bypass diode region is covered with the covering frame structure, so as to prevent an increase in the sulfur content in the bypass diode region caused by sulfur-containing gas used in the process of heat treatment.

In some embodiments, wherein the additional layer for layer treatment method comprises a buffer layer deposition on the surface of the absorber layer where the bypass diode region is covered with the covering frame structure, so as to prevent the deposition of the buffer layer in the bypass diode region.

In some embodiment, for a series thin-film photovoltaic cell,
when the series thin-film photovoltaic module is of a 4T structure, consisting of several thin-film photovoltaic modules placed on top of each other with at least one thin-film photovoltaic module is provided with the integrated bypass diode;
when the series thin-film photovoltaic module is of a 2T or 3T structure, the series thin-film photovoltaic cell comprises a top cell and a bottom cell, and the bypass diode region of the bottom cell is covered with the covering frame structure, so as to prevent deposition of the top cell in the bypass diode region.

In some embodiments, the covering frame structure is combined with a carrier for supporting the substrate in the layer deposition treatment process and a process cover plate in the heat treatment process.

In a second aspect, a manufacturing method for the aforementioned thin-film photovoltaic solar module with one or more integrated bypass diodes is provided, comprising the steps of:
providing a substrate with a suitable multi-portion covering frame structure;
combining the substrate with part or all of the covering frame structure, so that the covering frame structure covers part of the surface of the substrate; and
introducing the substrate into a treatment chamber to coat the surface part of the substrate opened by the covering frame structure.

In some embodiments, the providing a substrate with a suitable multi-portion covering frame structure further comprises: providing a carrier for supporting the substrate in the layer deposition treatment process and/or a process cover plate in the heat treatment process.

REFERENCE NUMERALS

1. Covering frame structure; 2. Process cover plate; 3. Coated substrate; 4. Carrier; 5. Seal; 1a. Lower frame structure; 1b. Upper frame structure.

DESCRIPTION OF EMBODIMENTS

According to the existing technology, there are different methods to increase the open-circuit voltage of solar modules under illumination under different thin-film techniques in the process of manufacturing thin-film modules. These methods are mainly used to increase the efficiency of solar modules, but when solar cells operate as diodes in the absence of illumination, such as in the case of integrated bypass diodes, it will lead to an undesired increase in a threshold voltage Us.

Essentially, in these methods for increasing the open-circuit voltage Voc, the saturation current density of the diodes is decreased, where the band gap of a material system is increased by mixing other elements/substances in a semiconductor material matrix, or the recombination loss of generated charge carriers is minimized by passivating the defects, crystal defects and grain boundaries in the semiconductor bulk material or at the interface of adjacent layers of a semiconductor material matrix or a solar cell structure.

The present invention provides a thin-film photovoltaic cell with one or more integrated bypass diodes, the bypass diode of each monolithic cell is formed on a substrate in the form of a thin film, and adopts a structure similar to that of the monolithic cell; each monolithic cell and the corresponding bypass diode share the same substrate; the layer treatment method for the thin film in a bypass diode region on the substrate is different from that for the cell region, and a compound material adopted as the layer of the thin film in the bypass diode region on the substrate is different from that in a cell region, so as to decrease a threshold voltage of the bypass diode.

Figure 1:
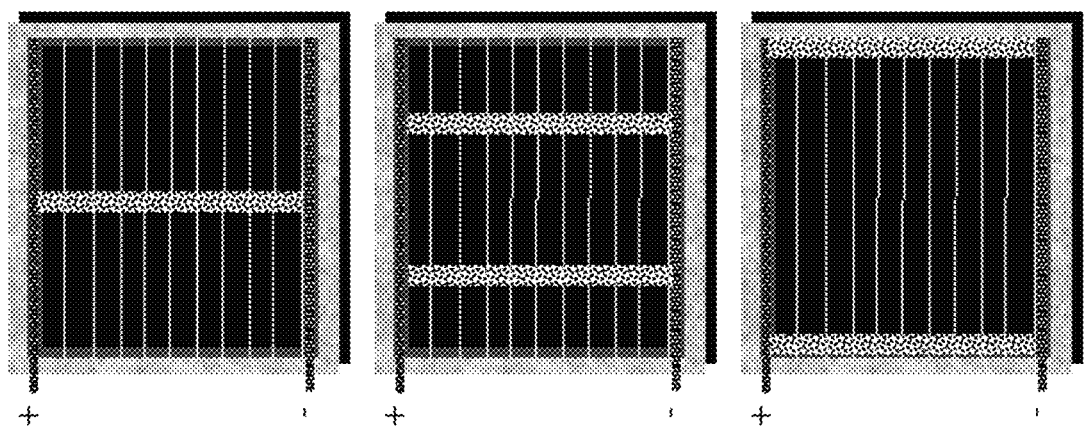
FIG. 1 is a schematic diagram of the position of a bypass diode region on a thin-film photovoltaic module.
Figure 1:

See the solar cell module disclosed in PCT/EP2007/053450, where a manufacturing method for bypass diodes of a solar cell is disclosed, and a bypass diode region on the thin-film photovoltaic cell is shown in FIG. 1. The objective of the present invention is to prevent the increase of the band gap of a material system or the increase of local recombination loss in a region where integrated bypass diodes are located.

Specifically, this is realized by partially covering the integrated bypass diode region of the thin-film photovoltaic cell, so that the addition of additional elements/substances in a semiconductor matrix to increase the band gap of the material system is avoided. Covering the integrated bypass diode region, the layer treatment method for the thin film in the bypass diode region on the substrate is different from that for the cell region, so that the layer treatment process for the cell region will not affect that for the thin film of the bypass diode region, and the layer treatment of the bypass diode region may adopt a treatment method or a compound material different from that for the cell region.

In addition to the partial coverage of a uniform material mixture, process control in which other elements in the semiconductor matrix are only locally mixed is also an alternative.

When an additional interface layer for passivation defects, crystal defects, grain boundaries and so on are deposited in a solar cell stack, the same procedure for partial coverage or application may be adopted.

Alternatively, for a process with additional temperature treatment, process control with thermal budget may also be only locally applied, e.g. by local laser pulse annealing.

The present invention may be applied to all thin-film techniques with the integrated series connection of individual cells, such as thin-film silicon modules, chalcopyrite modules (CIS, CIGS, CIGSSe, CZTS, etc.), II-VI-based modules (e.g. CdTe), organic or dye-sensitized modules, perovskite modules, etc. The present invention may also be applied to all tandem technologies with integrated series connection, particularly different combinations of thin-film techniques, such as perovskite-CIGS tandems, CIGS-CIGS tandems, perovskite-perovskite tandems, etc.

Specifically, the layer includes, but is not limited to, an absorber layer and an additional layer for the passivation of grain boundary defects and lattice defects, the layer treatment method includes a deposition treatment process and a heat treatment process for the layer, and the deposition treatment process includes PVD (Physical Vapor Deposition) coating process, thermal evaporation and spraying. It can be understood that the thin-film photovoltaic cell includes a substrate, a back electrode layer, a layer structure (an absorber layer and a buffer layer) and a front electrode layer in sequence, and further, a post-treatment layer PDT may be deposited on the upper surface of the absorber layer. In the present application, the bypass diode adopts a structure similar to that of a monolithic cell, and the bypass diode region also has the aforementioned variety of film layers. The deposition treatment process for the buffer layer includes atomic layer deposition (ALD), Ion layer gas reaction (ILGAR), spray pyrolysis, chemical vapor deposition (CVD) or physical vapor deposition (PVD), sputtering, thermal evaporation or electron beam evaporation. The deposition process for the post-treatment layer includes: depositing at least one post-treatment material on the absorber layer by thermal evaporation, wet chemical bath deposition, electron beam evaporation, sputtering, atomic layer deposition or spray pyrolysis, and then diffusing the post-treatment material into the absorber layer by heating the post-treatment layer.

In the present invention, when the layer of the cell region on the substrate is treated, the bypass diode region is covered with a covering frame structure, so that the layer treatment in the cell region and the layer treatment in the bypass diode region are not performed at the same time and a thin-film compound material applied in the cell region is prevented from infiltrating into the bypass diode region.

Figure 2:
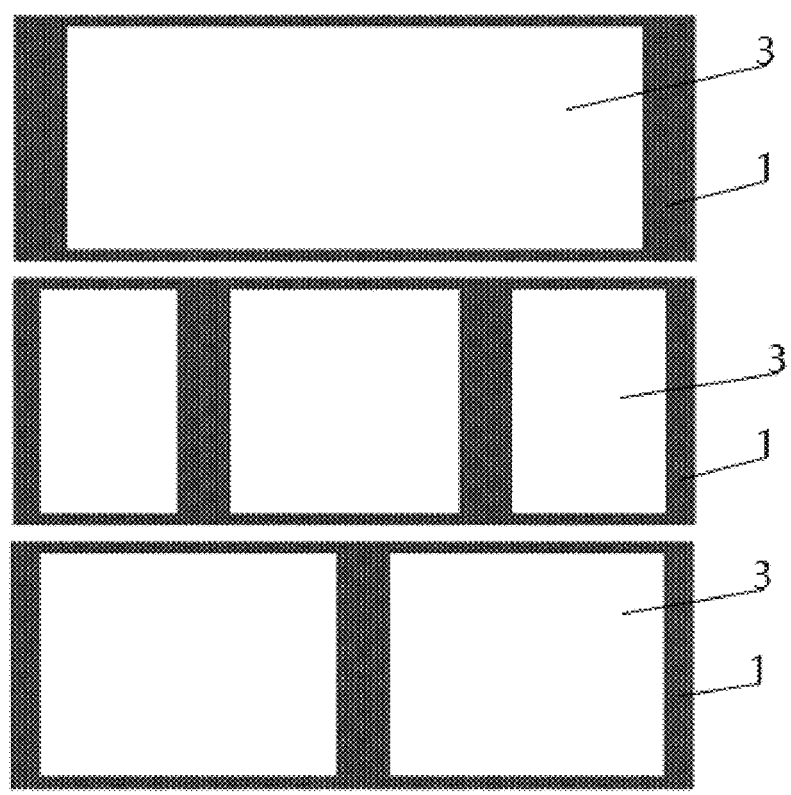
FIG. 2 is a schematic diagram of a method of covering the bypass diode region on the thin-film photovoltaic module with a covering frame structure.

In the embodiments of the present application, the bypass diode region on the thin-film photovoltaic cell is covered with a covering frame structure, which may be made of a ceramic material. FIG. 1 shows a schematic diagram of the position of the bypass diode region in the top view of the thin-film photovoltaic cell. For the bypass diode region shown in FIG. 1, a method for covering the bypass diode region shown in FIG. 2 is adopted, which uses a frame structure 1 to cover the bypass diode region. The frame structure 1 is an open structure, so that the uncovered region of the coated substrate 3 is exposed, that is, the cell region on the substrate is exposed, and thus, the uncovered region of the coated substrate 3 can be subjected to layer treatment.

In one embodiment, for a monolithic thin-film photovoltaic cell, a compound material adopted as the absorber layer in the cell region includes a chalcopyrite compound semiconductor containing chalcogen, and a compound material adopted as the absorber layer in the bypass diode region is a chalcopyrite compound semiconductor without sulfur. In another embodiment, for the monolithic thin-film photovoltaic cell, the sulfur content in the compound material adopted as the absorber layer in the bypass diode region is less than that in the compound material adopted as the absorber layer in the cell region. Specifically, the absorber layer in the cell region and the absorber layer in the bypass diode region are deposited with different compound materials respectively, and the compound material adopted as the absorber layer in the bypass diode region reduces the content of sulfur or contains no sulfur, so as to decrease the threshold voltage of the bypass diode region. It can be understood that in one embodiment, the absorber layer in the cell region adopts sulfur-containing copper indium gallium sulfur selenide material ($Cu(In,Ga)(S,Se)_2$ material), and the absorber layer in the bypass diode region adopts sulfur-free copper indium gallium selenide (Cu(In,Ga)Se$_2$ material).

Then, for the monolithic thin-film photovoltaic cell, when the absorber layer is treated, the absorber layer in the cell region and the absorber layer in the bypass diode region are treated separately, and when the absorber layer in the cell region is treated, the bypass diode region is covered with the covering frame structure, so as to prevent the compound material adopted as the absorber layer in the cell region from infiltrating into the bypass diode region. In the embodiments of the present application, when the absorber layer in the cell region is formed, the bypass diode region is partially covered to prevent the compound material of the absorber layer in the cell region from infiltrating into the bypass diode region, i.e. preventing sulfur from infiltrating into the bypass diode region.

The aforementioned additional layer for the passivation of grain boundary defects and lattice defects include a PDT post-treatment layer applied on the surface of the absorber layer. In the embodiments of the present application, in order to passivate grain boundary defects and lattice defects, a post-treatment layer is deposited on the upper surface of the absorber layer. A compound material adopted as the post-treatment layer includes a metal chalcogenide, an oxygen compound of the metal chalcogenide, and a hydroxide compound of the metal chalcogenide (particularly with an oxidation state IV or VI). Specifically, the deposition treatment process for the post-treatment layer includes three stages. In the first stage, at least one post-treatment material is deposited on the absorber layer by thermal evaporation, wet chemical bath deposition, electron beam evaporation, sputtering, atomic layer deposition or spray pyrolysis. In the second stage, the post-treatment material is diffused into the absorber layer by a heat treatment process. In the third stage, after the post-treatment material is diffused into the absorber layer, the post-treatment material existing on the surface of the absorber layer is removed from the surface of the absorber layer.

In one embodiment, for the monolithic thin-film photovoltaic cell, the PDT post-treatment layer is applied on the surface of the absorber layer in the cell region but not applied on the surface of the absorber layer in the bypass diode region. In another embodiment, for the monolithic thin-film photovoltaic cell, the amount of a compound material adopted as the PDT post-treatment layer in the bypass diode region is less than the amount of the compound material adopted as the PDT post-treatment layer in the cell region. In the embodiments of the present application, the surface of the absorber layer in the cell region is subjected to post-treatment to form the PDT post-treatment layer, and no post-deposition treatment material compound is added or little post-deposition treatment material compound is adopted on the surface of the absorber layer in the bypass diode region, so as to decrease the threshold voltage of the bypass diode region.

Then, for the monolithic thin-film photovoltaic cell, when the PDT post-treatment layer is treated, the PDT post-treatment layer in the cell region and the PDT post-treatment layer in the bypass diode region are treated separately, and when the PDT post-treatment layer in the cell region is treated, the bypass diode region is covered with the covering frame structure, so as to prevent the compound material adopted as the PDT post-treatment layer in the cell region from infiltrating into the bypass diode region.

In the embodiments of the present application, the bypass diode region is covered, and after the absorber layers in the cell region and bypass diode region of the thin-film photovoltaic cell are formed, the PDT post-treatment layer is deposited on the upper surface of the absorber layer in the cell region and the absorber layer in the bypass diode region is not treated or is subjected to post-deposition treatment by adopting a small content of compound material of the PDT post-treatment layer.

In one embodiment, according to the thin-film photovoltaic cell with one or more integrated bypass diodes provided by the present invention, during heat treatment in the process of making the thin-film photovoltaic cell, the cell region is partially heated. Specifically, in the embodiments of the present application, the layer treatment method for the thin film in the bypass diode region on the substrate is different from that for the cell region, including: partially heating the cell region during multiple heat treatment processes. For example, the cell region is only partially heated by the heat treatment process during heat treatment carried out in the process of depositing the absorber layer or post-deposition treatment carried out on the absorber layer.

Further, according to the thin-film photovoltaic cell with one or more integrated bypass diodes provided by the present invention, during heat treatment in the process of making the thin-film photovoltaic cell, the bypass diode region is covered with the covering frame structure, so as to prevent an increase in the sulfur content in the bypass diode region caused by sulfur-containing gas used in the process of heat treatment. Specifically, in the embodiments of the present application, the layer treatment method for the thin film in the bypass diode region on the substrate is different from that for the cell region, further including: covering the bypass diode region with the covering frame structure during the multiple heat treatment processes. It can be understood that the heat treatment process is carried out in an atmosphere containing sulfur in a vacuum environment, and covering the bypass diode region with the covering frame structure can prevent sulfur from infiltrating into the bypass diode region during heat treatment, reducing the increase of the sulfur content in the bypass diode region. For example, when the absorber layer is subjected to RTP (Rapid Thermal Processing) annealing, the bypass diode region is covered with the covering frame structure to prevent the increase of the sulfur content in the absorber layer in the bypass diode region caused by the H$_2$S gas used in the annealing process.

The aforementioned additional layer for the passivation of interface defects and decrease of interface recombination include a buffer layer applied on the surface of the absorber layer. In the embodiments of the present application, in order to passivate interface defects and decrease interface recombination, a buffer layer is deposited on the upper surface of the absorber layer. A compound material adopted as the buffer layer includes CdS, In$_x$S$_y$, In$_x$S$_y$ doped/alloyed with Na, ZnS, ZnO, Zn$_x$Mg$_{1-x}$O, ZnO$_x$S$_{1-x}$, Ga$_x$O$_y$. The buffer layer is deposited on the absorber layer by thermal evaporation, wet chemical bath deposition, electron beam evaporation, sputtering, atomic layer deposition or spray pyrolysis.

Based on the description of the aforementioned thin-film photovoltaic cell with one or more integrated bypass diodes, it can be understood that when applied to the preparation of a series thin-film photovoltaic cell, there are the following two preparation methods:

In the first preparation method, when the series thin-film photovoltaic module is of a 4T structure, consisting of several electrically connected thin-film photovoltaic modules placed on top of each other with at least one thin-film photovoltaic module is provided with the integrated bypass diode;

in the second preparation method, when the series thin-film photovoltaic module is of a 2T or 3T structure, the series thin-film photovoltaic cell includes a top cell and a bottom cell, and a bypass diode region of the bottom cell is covered with the covering frame structure, so as to prevent the deposition of the top cell in the bypass diode region.

In the embodiments of the present application, for a four-terminal series thin-film photovoltaic module, the whole series structure includes a plurality of thin-film photovoltaic cells which are applied in a superposing manner and electrically connected, and an integrated bypass diode is manufactured for at least one thin-film photovoltaic cell by the aforementioned bypass diode manufacturing method. Of course, each thin-film photovoltaic cell may be provided with an integrated bypass diode mentioned above.

For a two-terminal or three-terminal series thin-film photovoltaic module, for the thin-film photovoltaic cell at the bottom of the series structure, an integrated bypass diode is manufactured by covering the bottom cell with the covering frame by the aforementioned bypass diode manufacturing method as to prevent the deposition of the top cell layers in the bypass diode region.

Figure 3:
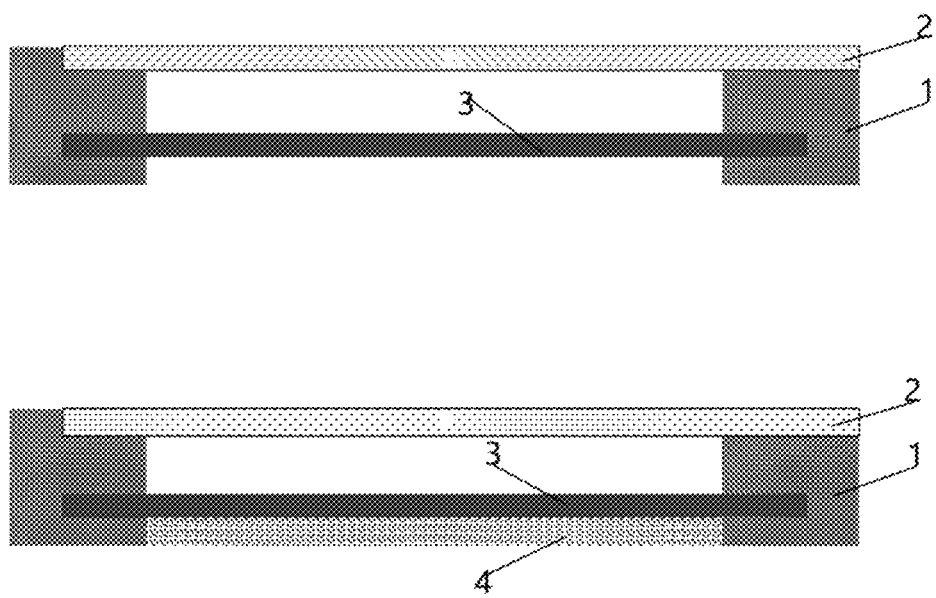
FIG. 3 is a schematic diagram of a method of using the covering frame structure and a movable process cover plate in combination.
Figure 4:
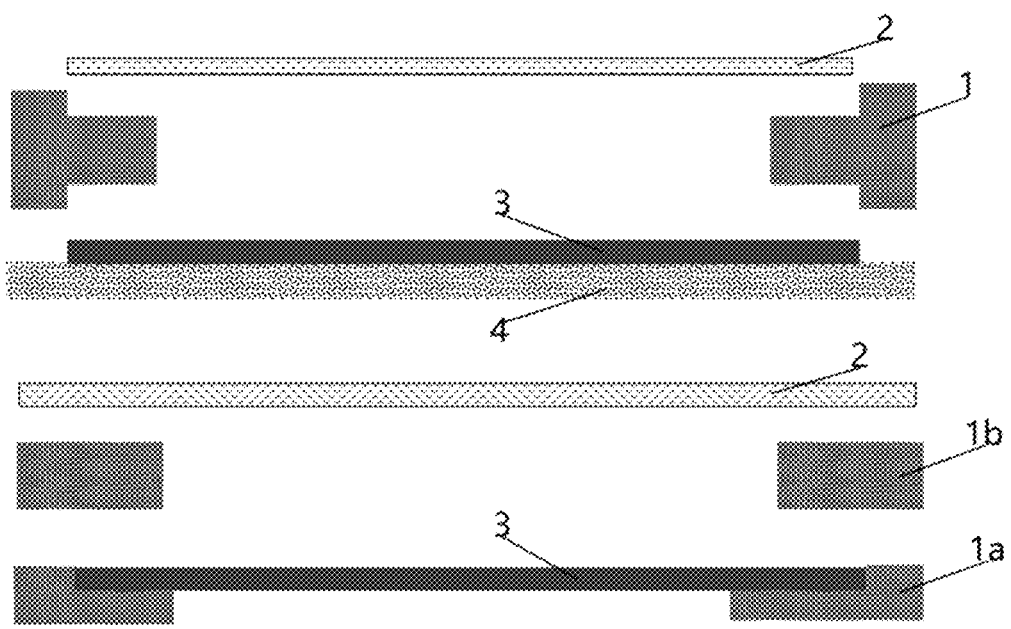
FIG. 4 is a schematic diagram of another method of using the covering frame structure and the movable process cover plate in combination.
Figure 5:
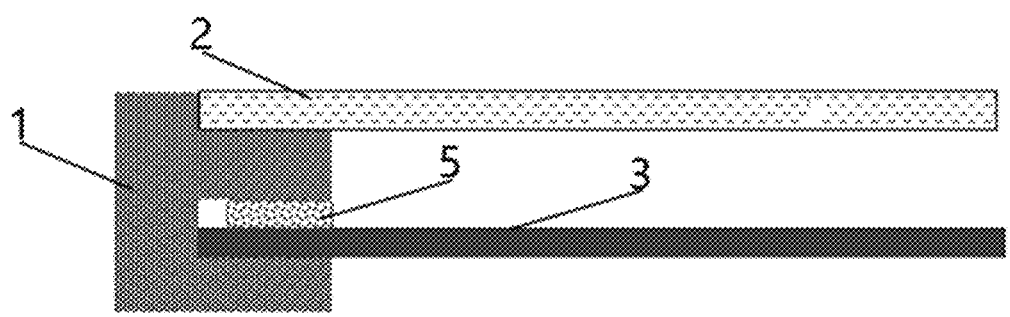
FIG. 5 is a schematic diagram of a method of using an additional seal in combination when the covering frame structure and the movable process cover plate are combined.
Figure 6:
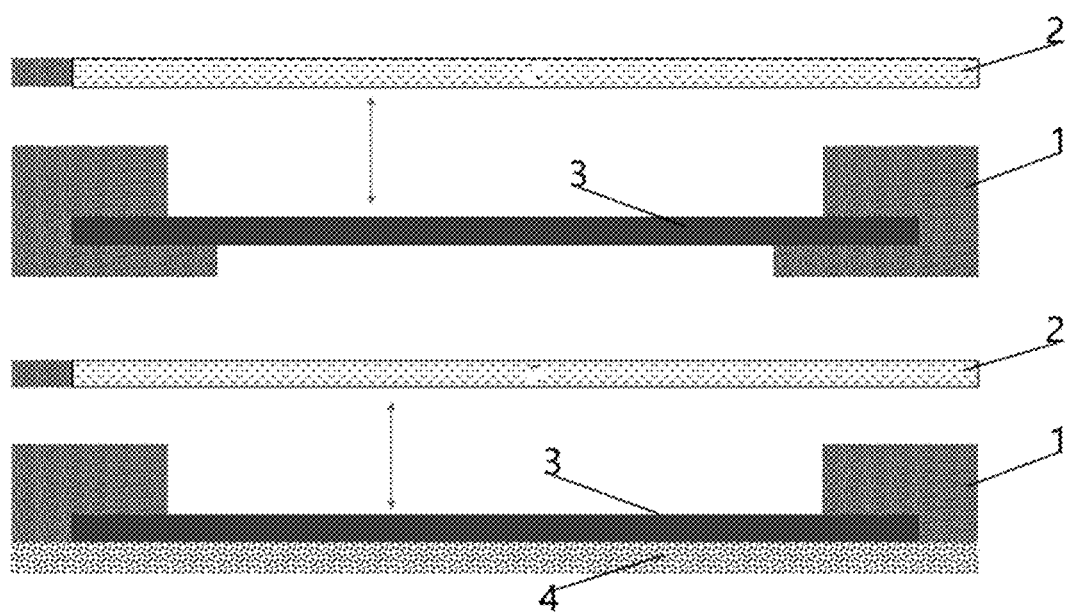
FIG. 6 is a schematic diagram of a method of using the covering frame structure and the stationary process cover plate in combination.

According to the thin-film photovoltaic cell with one or more integrated bypass diodes provided by the present invention, in the process of making the thin-film photovoltaic cell, the covering frame structure 1 for covering the bypass diode region is used in cooperation with other auxiliary structures in various processes; if a carrier 4 for supporting the substrate is adopted in the layer deposition treatment process, the aforementioned covering frame structure 1 for covering the bypass diode region is used in combination with the carrier 4; and if a process cover plate 2 is used in the heat treatment process, the aforementioned covering frame structure 1 for covering the bypass diode region is used in combination with the process cover plate 2. Specifically, for example, in a layer structure deposition process, if the carrier for supporting and fixing the substrate is adopted, the combination of the carrier and the aforementioned covering frame structure jointly carry out the layer structure deposition process; and for example, in the heat treatment process, if the process cover plate disclosed in PCT/EP2009/003301 is adopted, the combination of the process cover plate and the aforementioned covering frame structure jointly carry out the heat treatment process. Specifically, taking the heat treatment process as an example, FIGS. 3 to 6 show schematic diagrams of methods of using the covering frame structure in combination with the carrier and the process cover plate. By adopting the heat treatment process disclosed in PCT/EP2009/003301, the covering frame structure in the present invention may be used not only in the case that the process cover plate is movable, but also in the case that the process cover plate is stationary. FIGS. 3 and 4 show schematic diagrams of the method of using the covering frame structure in combination with the movable process cover plate. FIG. 5 shows a schematic diagram of the method of using the covering frame structure 1 and the movable process cover plate 2 in combination with a seal 5 added for adjusting different thermal expansion coefficients. FIG. 6 shows a schematic diagram of the method of using the covering frame structure and the stationary process cover plate in combination.

A manufacturing method for the aforementioned thin-film photovoltaic cell with one or more integrated bypass diodes includes the steps of:

(Step A1) providing a substrate with a suitable multi-portion covering frame structure;

(Step A2) combining the substrate with part or all of the covering frame structure, so that the covering frame structure covers part of the surface of the substrate; and (Step A3) introducing the substrate into a treatment chamber to coat the surface part of the substrate opened by the covering frame structure.

Specifically, the providing a substrate with a suitable multi-portion covering frame structure in Step A1 further includes: providing a carrier for supporting the substrate in the layer deposition treatment process and/or a process cover plate in the heat treatment process.

Specifically, the manufacturing method for the aforementioned thin-film photovoltaic cell with one or more integrated bypass diodes includes the steps of:

(Step B1) providing a substrate with a suitable multi-portion covering frame structure, and if necessary, providing the substrate with both a carrier and a process cover plate, so that the covering frame structure, the carrier and the process cover plate are used in combination to carry out a layer structure deposition treatment process and multiple heat treatment processes for the thin-film photovoltaic cell;

(Step B2) covering the substrate with the covering frame structure provided in Step B1, so that part of the surface of the substrate is covered by the covering frame structure, specifically a bypass diode region on the surface of the substrate being covered by the covering frame structure, and if necessary, combining the carrier and the process cover plate provided in Step B1 with the substrate and the covering frame structure according to the methods in FIGS. 3 to 6;

(Step B3) introducing the substrate and the covering frame structure combined in Step B2 into a treatment chamber to coat the part of the surface of the substrate not covered by the covering frame structure, or introducing the substrate, the covering frame structure, the carrier and the process cover plate combined in Step B2 into the treatment chamber to coat the part of the surface of the substrate not covered by the covering frame structure.

The voltage-current characteristic curve of the bypass diodes in the bypass diode regions of the thin-film photovoltaic cell with one or more integrated bypass diode manufactured by the aforementioned method is significantly optimized and improved, and the optimization effect will be described in detail below.

Figure 7:
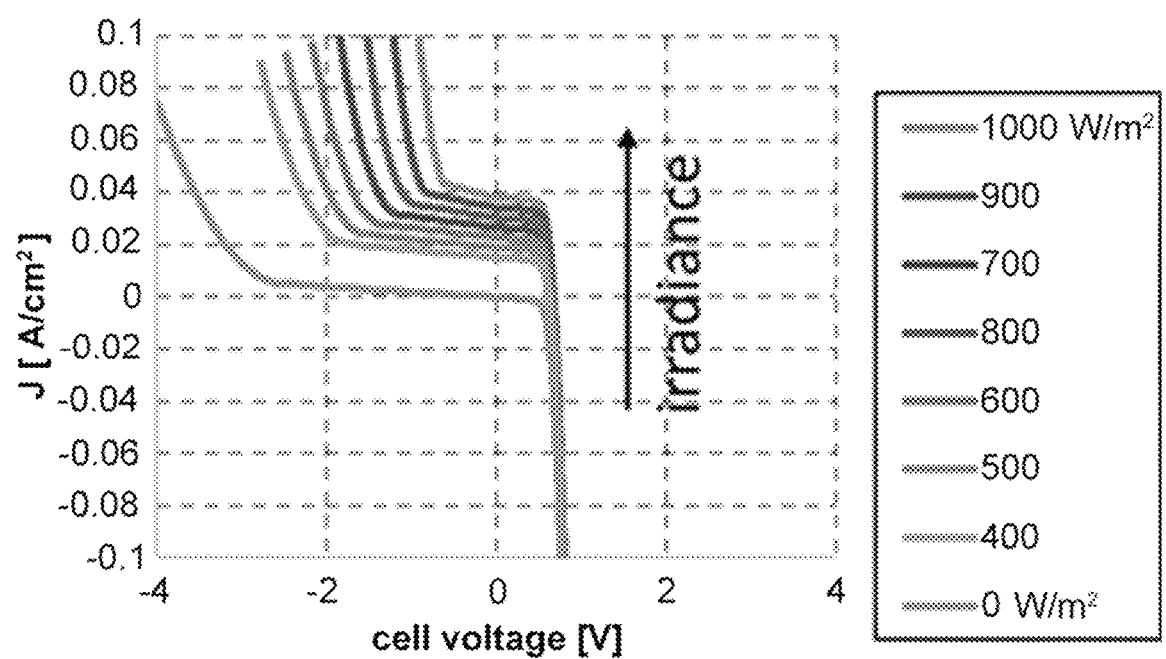
FIG. 7 is a graph showing current/voltage (IV) curves of a CIGS solar cell with varying illumination.
Figure 8:
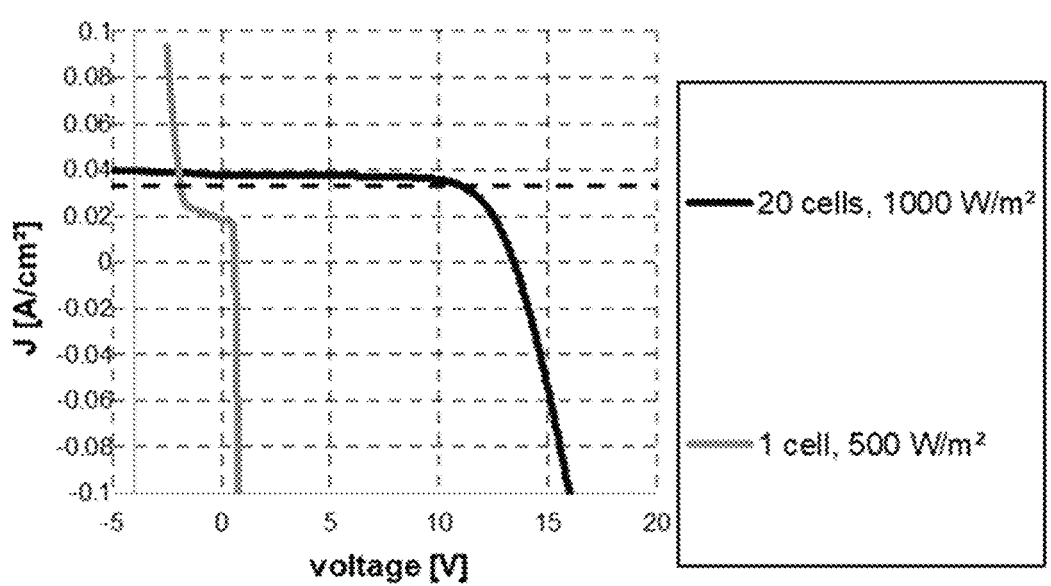
FIG. 8 is a graph showing the IV curve of a series connection of 20 fully illuminated solar cells and the IV curve of one half-shaded solar cell. The dashed line indicates the current during operation (maximum power point).
Figure 9:
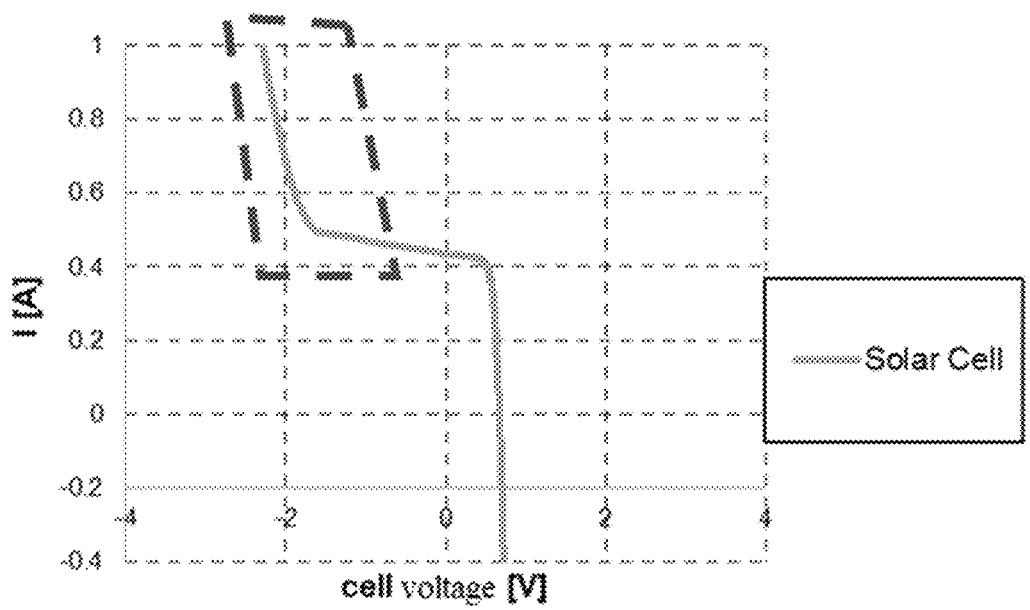
FIG. 9 is an IV characteristic curve of a single monolithic solar cell in the absence of a bypass diode, where the dashed box area is the potentially harmful region of operation.

In general, as shown in FIG. 7, the characteristic curve of the monolithic CIGS solar cell is generally related to sunshine and temperature, and in particular, the reverse characteristic has a strong relationship with sunshine. As shown in FIG. 8, even if a small number of monolithic thin-film photovoltaic cells are half shaded, it will still lead to the generation of reverse current (negative voltage). In the absence of the bypass diode, the characteristic curve of a monolithic thin-film photovoltaic cell is shown in FIG. 9. It can be understood that the reverse current (negative voltage) generated by a thin-film photovoltaic cell will damage the material of monolithic thin-film photovoltaic cells.

Figure 10:
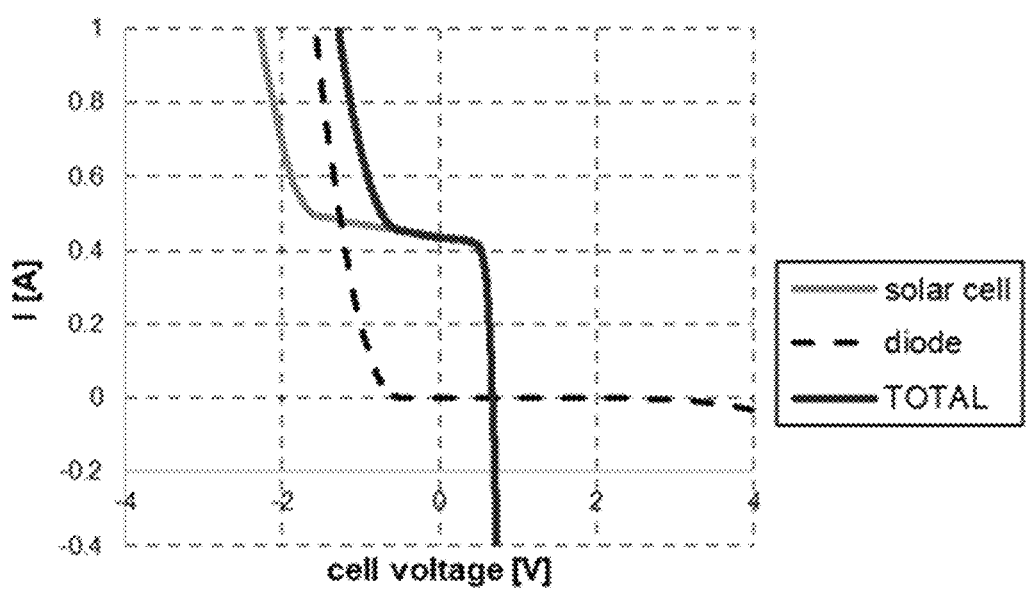
FIG. 10 is an overall IV characteristic curve of an illuminated single monolithic solar cell connected in parallel with a shadowed bypass diode of similar cell material.

When the thin-film photovoltaic cell with one or more integrated bypass diodes where the bypass diodes are fabricated with similar or same cell material as the photovoltaic cell, the voltage-current characteristic curve of the thin-film photovoltaic cell with one or more integrated bypass diodes is shown in FIG. 10 under the condition that the cell region is not shaded and the bypass diode region is shaded. The shaded bypass diode region operates at potentially harmful negative voltages under high power consumption and heat dissipation.

Figure 11:
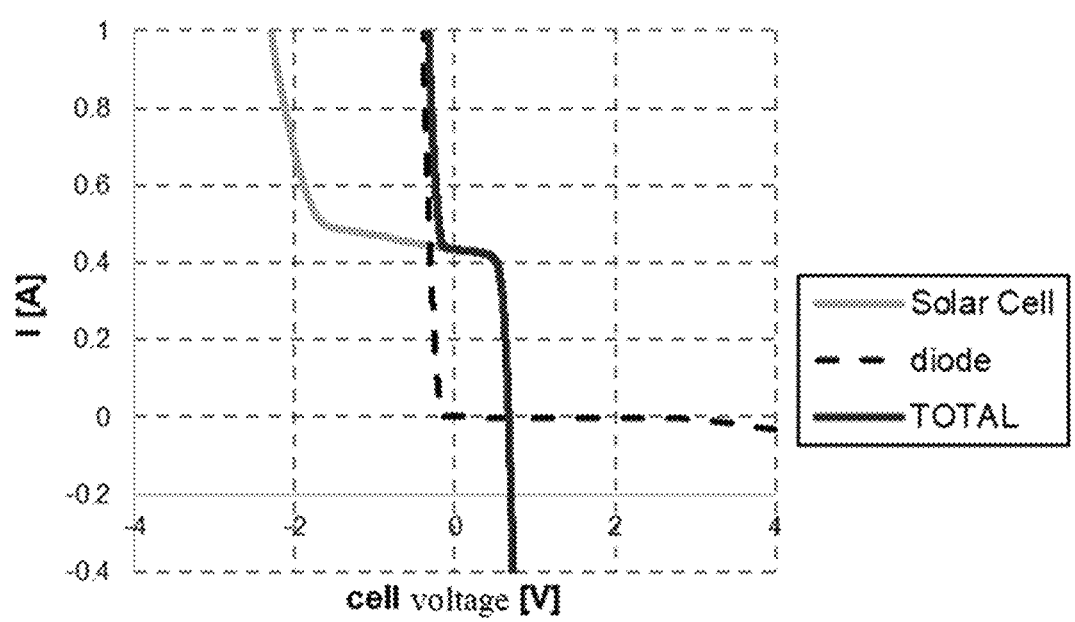
FIG. 11 is an overall IV characteristic curve of an illuminated single monolithic solar cell connected in parallel with a shadowed bypass diode after the reduction of the threshold voltage of the bypass diode.

When the thin-film photovoltaic cell with one or more integrated bypass diodes according to the present invention is adopted, the voltage-current characteristic curve of the thin-film photovoltaic cell with one or more integrated bypass diodes is shown in FIG. 11 under the condition that the cell region is not shaded and the bypass diode region is shaded. The decrease of forward voltage in the bypass diode region greatly reduces the power consumption in the dangerous region (negative voltage). Therefore, the bypass diode can become smaller in size or receive higher power, decreasing the probability of damaging the material of the monolithic thin-film photovoltaic cells.

As shown in FIG. 11, under the condition that the size of the integrated bypass diode is reduced, the power consumption of the thin-film photovoltaic cell with one or more integrated bypass diodes according to the present invention is reduced from 1.3 watts to 0.3 watts (the threshold voltage is decreased from 1 V to 0.15 V) under the condition of 1A current.

The present invention is not limited to the aforementioned specific embodiments, and various changes which are made by those of ordinary skill in the art from the above idea without creative labor shall fall within the protection scope of the present invention.

What is claimed is:

1. A thin-film photovoltaic module with one or more integrated bypass diodes, the bypass diode of each monolithic cell being formed on a substrate in the form of a thin film and adopting a structure similar to that of the monolithic cell, and each monolithic cell and the corresponding bypass diode sharing the same substrate, wherein a layer treatment method for the thin film in a bypass diode region on the substrate is different from that for a cell region, and a compound material or layer sequence adopted as the layer of the thin film in the bypass diode region on the substrate is different from that in the cell region, so as to decrease a threshold voltage of the bypass diode.

2. The thin-film photovoltaic module with one or more integrated bypass diodes according to claim 1, wherein the layer comprises, but is not limited to, an absorber layer and an additional layer for the passivation of grain boundary defects and lattice defects, the layer treatment method comprises a deposition treatment process and a heat treatment process for the layer, wherein the deposition treatment process includes PVD (Physical Vapor Deposition) coating process, thermal evaporation and spraying.

3. The thin-film photovoltaic module with one or more integrated bypass diodes according to claim 2, wherein when the layer of the cell region on the substrate is treated, the bypass diode region is covered with a covering frame structure, so that the layer treatment in the cell region and the layer treatment in the bypass diode region are not performed at the same time and a thin-film compound material applied in the cell region is prevented from infiltrating into the bypass diode region.

4. The thin-film photovoltaic module with one or more integrated bypass diodes according to claim 2, wherein the covering frame structure adopts a ceramic material.

5. The thin-film photovoltaic module with one or more integrated bypass diodes according to claim 3, wherein for a monolithic thin-film photovoltaic cell, a compound material adopted as the absorber layer in the cell region includes a chalcopyrite compound semiconductor containing chalcogen, and a compound material adopted as the absorber layer in the bypass diode region is a chalcopyrite compound semiconductor without sulfur.

6. The thin-film photovoltaic module with one or more integrated bypass diodes according to claim 3, wherein for the monolithic thin-film photovoltaic cell, the sulfur content in the compound material adopted as the absorber layer in the bypass diode region is less than that in the compound material adopted as the absorber layer in the cell region.

7. The thin-film photovoltaic module with one or more integrated bypass diodes according to any of claim 5, wherein for the monolithic thin-film photovoltaic cell, when the absorber layer is treated, the absorber layer in the cell region and the absorber layer in the bypass diode region are treated separately, and when the absorber layer in the cell region is treated, the bypass diode region is covered with the covering frame structure, so as to prevent the compound material adopted as the absorber layer in the cell region from infiltrating into the bypass diode region.

8. The thin-film photovoltaic module with one or more integrated bypass diodes according to any of claim 6, wherein for the monolithic thin-film photovoltaic cell, when the absorber layer is treated, the absorber layer in the cell region and the absorber layer in the bypass diode region are treated separately, and when the absorber layer in the cell region is treated, the bypass diode region is covered with the covering frame structure, so as to prevent the compound material adopted as the absorber layer in the cell region from infiltrating into the bypass diode region.

9. The thin-film photovoltaic module with one or more integrated bypass diodes according to claim 3, wherein the additional layer for the passivation of grain boundary defects and lattice defects comprises a PDT post-treatment layer applied on the surface of the absorber layer.

10. The thin-film photovoltaic module with one or more integrated bypass diodes according to claim 9, wherein for the monolithic thin-film photovoltaic cell, the PDT post-treatment layer is applied on the surface of the absorber layer in the cell region but not applied on the surface of the absorber layer in the bypass diode region.

11. The thin-film photovoltaic module with one or more integrated bypass diodes according to claim 9, wherein for the monolithic thin-film photovoltaic cell, the amount of a compound material adopted as the PDT post-treatment layer in the bypass diode region is less than the amount of the compound material adopted as the PDT post-treatment layer in the cell region.

12. The thin-film photovoltaic module with one or more integrated bypass diodes according to any of claim 10, wherein for the monolithic thin-film photovoltaic cell, when the PDT post-treatment layer is treated, the PDT post-treatment layer in the cell region and the PDT post-treatment layer in the bypass diode region are treated separately, and when the PDT post-treatment layer in the cell region is treated, the bypass diode region is covered with the covering frame structure, so as to prevent the compound material adopted as the PDT post-treatment layer in the cell region from infiltrating into the bypass diode region.

13. The thin-film photovoltaic module with one or more integrated bypass diodes according to any of claim 11, wherein for the monolithic thin-film photovoltaic cell, when the PDT post-treatment layer is treated, the PDT post-treatment layer in the cell region and the PDT post-treatment layer in the bypass diode region are treated separately, and when the PDT post-treatment layer in the cell region is treated, the bypass diode region is covered with the covering frame structure, so as to prevent the compound material adopted as the PDT post-treatment layer in the cell region from infiltrating into the bypass diode region.

14. The thin-film photovoltaic module with one or more integrated bypass diodes according to claim 13, wherein during heat treatment in the process of making the thin-film photovoltaic cell, the cell region is partially heated.

15. The thin-film photovoltaic module with one or more integrated bypass diodes according to claim 3, wherein during heat treatment in the process of making the thin-film photovoltaic cell, the bypass diode region is covered with the covering frame structure, so as to prevent an increase in the sulfur content in the bypass diode region caused by sulfur-containing gas used in the process of heat treatment.

16. The thin-film photovoltaic module with one or more integrated bypass diodes according to claim 2, wherein the additional layer for layer treatment method comprises a buffer layer deposition on the surface of the absorber layer where the bypass diode region is covered with the covering frame structure, so as to prevent the deposition of the buffer layer in the bypass diode region.

17. The thin-film photovoltaic module with one or more integrated bypass diodes according to claim 3, wherein for a series thin-film photovoltaic module,
when the series thin-film photovoltaic module is of a 4T structure consisting of several electrically connected thin-film photovoltaic modules placed on top of each other with at least one thin-film photovoltaic module is provided with the integrated bypass diode;
when the series thin-film photovoltaic module is of a 2T or 3T structure, the series thin-film photovoltaic cell comprises a top cell and a bottom cell, and the bypass diode region of the bottom cell is covered with the covering frame structure, so as to prevent deposition of the top cell layers in the bypass diode region.

18. The thin-film photovoltaic module with one or more integrated bypass diodes according to claim 3, wherein the covering frame structure is combined with a carrier for supporting the substrate in the layer deposition treatment process and a process cover plate in the heat treatment process.

* * * * *